(12) United States Patent
Kim et al.

(10) Patent No.: US 9,660,091 B2
(45) Date of Patent: May 23, 2017

(54) THIN FILM TRANSISTOR AND METHOD OF DRIVING SAME

(71) Applicant: Samsung Electronics Co., Ltd., Suwon-Si, Gyeonggi-Do (KR)

(72) Inventors: Eok-su Kim, Seongnam-si (KR); Myung-kwan Ryu, Yongin-si (KR); Kyoung-seok Son, Seoul (KR); Sung-hee Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 19 days.

(21) Appl. No.: 14/453,137

(22) Filed: Aug. 6, 2014

(65) Prior Publication Data

US 2015/0062475 A1    Mar. 5, 2015

(30) Foreign Application Priority Data

Sep. 5, 2013  (KR) .................. 10-2013-0106820

(51) Int. Cl.
| | | |
|---|---|---|
| *H01L 29/786* | (2006.01) | |
| *G02F 1/133* | (2006.01) | |
| *G02F 1/1368* | (2006.01) | |
| *H01L 27/12* | (2006.01) | |
| *H01L 29/417* | (2006.01) | |
| *H01L 29/423* | (2006.01) | |
| *G09G 3/36* | (2006.01) | |
| *H01L 29/49* | (2006.01) | |

(52) U.S. Cl.
CPC ...... *H01L 29/78648* (2013.01); *G02F 1/1368* (2013.01); *G09G 3/3648* (2013.01); *H01L 29/4908* (2013.01); *H01L 29/78645* (2013.01); *G02F 2001/13685* (2013.01); *G09G 2300/0426* (2013.01)

(58) Field of Classification Search
CPC .............. H01L 27/1251; H01L 51/055; H01L 51/0554; H01L 51/5296
USPC .......................................................... 257/57
See application file for complete search history.

(56) References Cited

U.S. PATENT DOCUMENTS

| | | | |
|---|---|---|---|
| 4,882,295 A * | 11/1989 | Czubatyj | H01L 27/0928 148/DIG. 1 |
| 5,124,769 A * | 6/1992 | Tanaka | H01L 29/7831 257/366 |
| 5,644,146 A * | 7/1997 | Arai | H01L 27/12 257/287 |
| 7,927,713 B2 | 4/2011 | Ye | |
| 2002/0084465 A1 | 7/2002 | Green et al. | |

(Continued)

FOREIGN PATENT DOCUMENTS

| | | |
|---|---|---|
| KR | 100102569 A | 9/1994 |
| KR | 100763912 B1 | 10/2007 |
| KR | 1020080055093 A | 6/2008 |

*Primary Examiner* — Jerome Jackson, Jr.
*Assistant Examiner* — David Spalla
(74) *Attorney, Agent, or Firm* — Harness, Dickey & Pierce, P.L.C.

(57) ABSTRACT

A thin film transistor (TFT) and a method of driving the same are disclosed. The TFT includes: an active layer; a bottom gate electrode disposed below the active layer to drive a first region of the active layer; and a top gate electrode disposed on the active layer to drive a second region of the active layer. The TFT controls the conductivity of the active layer by using the bottom gate electrode and the top gate electrode.

18 Claims, 9 Drawing Sheets

(56) References Cited

U.S. PATENT DOCUMENTS

| | | | | |
|---|---|---|---|---|
| 2011/0024755 A1* | 2/2011 | Korenari | ............ | H01L 27/1214 |
| | | | | 257/59 |
| 2011/0089995 A1* | 4/2011 | Heo | .................... | H01L 29/1606 |
| | | | | 327/534 |
| 2012/0153289 A1* | 6/2012 | Kaneko | ............ | H01L 29/78633 |
| | | | | 257/59 |
| 2014/0054588 A1* | 2/2014 | Maeda | ................ | H01L 29/7869 |
| | | | | 257/43 |

* cited by examiner

THIN FILM TRANSISTOR AND METHOD OF DRIVING SAME

RELATED APPLICATIONS

This application claims priority under 35 U.S.C. §119 to Korean Patent Application No. 10-2013-0106820, filed on Sep. 5, 2013, in the Korean Intellectual Property Office, the disclosure of which is incorporated herein in its entirety by reference.

BACKGROUND

1. Field

The present disclosure relates to thin film transistors (TFTs) and/or methods of driving the same, and more particularly, to TFTs capable of improving an on/off duty ratio and/or methods of driving the same.

2. Description of the Related Art

Thin film transistors (TFTs) are widely used as switching devices or driving devices in an electronic device field. For example, a TFT may be used as a switching device in a pixel of a display.

When a typical TFT is used as a switching device in a pixel of a display, a turn-off time of the TFT is much longer than a turn-on time thereof. Thus, an on/off duty ratio of the TFT is very small. That is, a turn-off voltage is applied to a gate of the TFT for almost all time.

For example, for an active matrix display using TFTs, a TFT is turned on by applying a turn-on voltage to one gate wiring connected thereto for a time period obtained by dividing a time allocated to one frame (1/frame frequency) by the total number of gate wirings, thereby delivering a voltage or a current therethrough.

For example, an on/off duty ratio for 120 Hz and a full high definition (FHD) (1920*1080 pixels) resolution is calculated as follows. One frame (=1/120) is 8.3 msec, and a turn-on time of a TFT is 8.3 msec/1080=7.7 μsec, and thus, the on/off duty ratio is about 0.001, i.e., about 0.1%.

As described above, a TFT is turned on only for a very short time during one frame and is turned off for the remaining time during which the TFT does not operate. This turn-on/off operation repeats with respect to each consecutive frame. Thus, an on/off duty ratio of the TFT is very small.

For a typical n-type TFT, a negative voltage is applied to a gate during a turn-off time, which occupies almost all time of one frame. Accordingly, a time period during which holes are trapped in an interface between a gate insulating layer and an active layer or inside the gate insulating layer is longer than a time period during which the holes are detrapped. As time goes by, trapped holes are accumulated. Thus, a threshold voltage of the TFT moves to a negative direction, thereby deteriorating the reliability thereof. On the contrary, for a p-type TFT, a positive voltage is applied to a gate during a turn-off time, which occupies almost all time of one frame. Accordingly, a time period during which electrons are trapped in an interface between a gate insulating layer and an active layer or inside the gate insulating layer is longer than a time period for which the electrons are detrapped. As time goes by, trapped electrons are accumulated. Thus, a threshold voltage of the TFT moves to a positive direction, thereby deteriorating the reliability thereof.

As described above, when an on/off duty ratio of a TFT is small, holes or electrons are trapped in an interface between a gate insulating layer and an active layer or inside the gate insulating layer. As time goes by, a threshold voltage of the TFT moves, thereby deteriorating the reliability thereof.

SUMMARY

Some example embodiments provide thin film transistors (TFTs) having a stable threshold voltage for securing relatively high reliability by improving an on/off duty ratio thereof, methods of driving the same, and/or displays including the same.

Additional example embodiments will be set forth in part in the description which follows and, in part, will be apparent from the description, or may be learned by practice of the presented example embodiments.

According to an example embodiment, a thin film transistor (TFT) may include an active layer, a bottom gate electrode disposed below the active layer to drive a first region of the active layer, and a top gate electrode disposed on the active layer to drive a second region of the active layer, the bottom and top gate electrodes configured to control the conductivity of the active layer.

At least one partial region of the bottom gate electrode and the top gate electrode may vertically overlap with each other.

The bottom gate electrode and the top gate electrode may be single gate electrodes, respectively, be disposed to extend in opposite directions, and vertically overlap with each other at that the at least one partial region.

The bottom gate electrode may include first and second bottom gate electrodes separated from each other and the at least one partial region includes the first and second partial regions, and the top gate electrode may be disposed between the first and second bottom gate electrodes and vertically overlaps with the first and second bottom gate electrodes at the first and second partial regions, respectively.

The top gate electrode may include first and second top gate electrodes separated from each other and the at least one partial region includes the first and second partial regions, and the bottom gate electrode may be disposed between the first and second top gate electrodes and vertically overlaps with the first and second top gate electrodes at the first and second partial regions, respectively.

The bottom gate electrode and the top gate electrode may be provided to not have a region at which the bottom gate electrode and the top gate electrode vertically overlap with each other.

The bottom gate electrode may include first and second bottom gate electrodes separated from each other, and the top gate electrode may be disposed between the first and second bottom gate electrodes.

The top gate electrode may include first and second top gate electrodes separated from each other, and the bottom gate electrode may be disposed between the first and second top gate electrodes.

The first region and the second region may have a shared region.

The first region and the second region may not have a shared region.

When the first region and the second region do not have a shared region, a separation distance between the first region and the second region may be within a range in which a current flows between a source electrode and a drain electrode through the active layer when a turn-on voltage is applied to both the bottom gate electrode and the top gate electrode.

The TFT may further include a substrate having the bottom gate electrode thereon, a gate insulating layer formed on the bottom gate electrode and under the active layer, a source electrode and a drain electrode formed to be in contact with both ends of the active layer, and a protective layer covering the active layer and under the top gate electrode.

The TFT may further include an etch-stop layer between the active layer and the protective layer.

The protective layer may be in direct contact with the active layer.

The TFT may be used as a switching device in a pixel of a display.

According to an example embodiment, a method of driving a thin film transistor (TFT) used as a switching device in a pixel of a display may include applying a turn-on voltage to both the bottom gate electrode and the top gate electrode for a turn-on time period so that a current flows through the TFT, during each frame, and applying a turn-off voltage to any one of the bottom gate electrode and the top gate electrode for a turn-off time period so that the TFT is turned off, during each frames when the TFT is used as a switching device in a pixel of a display, wherein when the TFT is turned off, the turn-off voltage is alternately applied to one of the top gate electrode and the bottom gate electrode with respect to each consecutive frame.

The turn-on voltage may be applied to both the top gate electrode and the bottom gate electrode for the turn-on time period, and for the turn-off time period, the turn-on voltage may be applied to any one of the top gate electrode and the bottom gate electrode, and the turn-off voltage may be applied to the other one, alternatively, with respect to each consecutive frame.

The turn-on voltage may be applied to both the top gate electrode and the bottom gate electrode for the turn-on time period, and for the turn-off time period, the turn-on voltage may be applied to any one of the top gate electrode and the bottom gate electrode, and a predetermined voltage may be applied to the other one, alternatively, with respect to each consecutive frame.

The display may be an active matrix display, the turn-on voltage may be applied to both a top gate electrode and a bottom gate electrode of a TFT connected to a corresponding gate wiring for a turn-on time period obtained by dividing a time allocated to one frame by a total number of effective gate wirings.

BRIEF DESCRIPTION OF THE DRAWINGS

Example embodiments will become apparent and more readily appreciated from the following description of some example embodiments, taken in conjunction with the accompanying drawings in which.

DETAILED DESCRIPTION

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are merely provided so that this disclosure will be thorough and complete, and will fully convey the scope of example embodiments to those skilled in the art. In the drawings, the sizes and relative sizes of the various layers and regions may have been exaggerated for clarity. Like numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some example embodiments will be explained in further detail with reference to the accompanying drawings.

FIGS. 1 to 6 are cross-sectional views of a thin film transistor (TFT) according to example embodiments.

Referring to FIGS. 1 to 6, the TFT according to example embodiments may control the conductivity of an active layer 40 by using a bottom gate electrode 30 and a top gate electrode 90. The TFT may include the active layer 40, the bottom gate electrode 30 disposed below the active layer 40 and configured to drive a partial region of the active layer 40, e.g., a first region A, and the top gate electrode 90 disposed on the active layer 40 and configured to drive a region including another partial region of the active layer 40, e.g., a second region B. The first region A and the second region B may include a shared region. For example, the first region A and the second region B may not include a shared region. In this case, a separation distance between the first region A and the second region B may be within a range in which a current flows between a first electrode 60 and a second electrode 70 through the active layer 40 when a turn-on voltage is applied to both the bottom gate electrode 30 and the top gate electrode 90. Any one of the first electrode 60 and the second electrode 70 may be a source electrode, and the other one may be a drain electrode.

Figure 1:
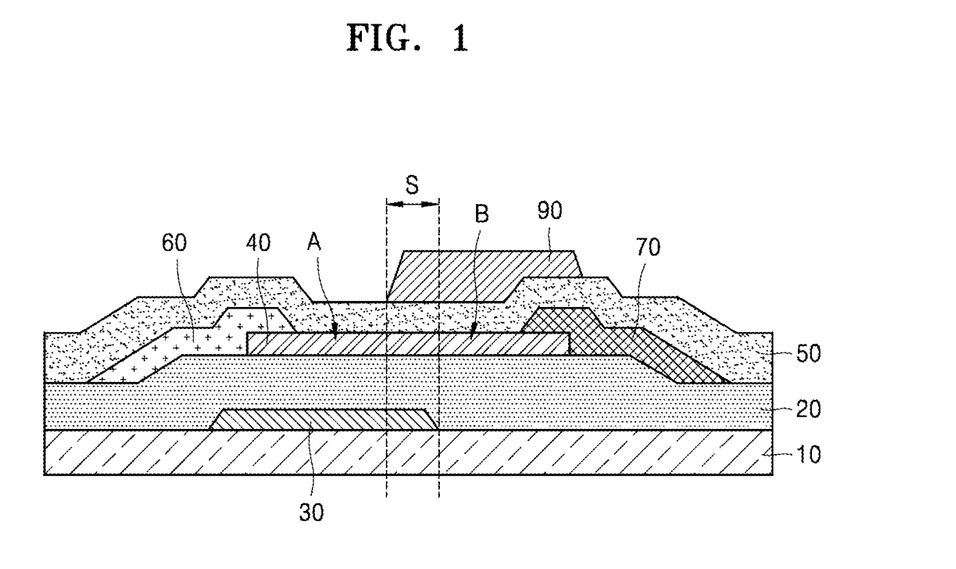
FIGS. 1 to 9 are cross-sectional views of a thin film transistor (TFT) according to example embodiments.

The bottom gate electrode 30 may be formed on a substrate 10, and a gate insulating layer 20 may be formed on the bottom gate electrode 30. The active layer 40 may be formed on the gate insulating layer 20. The first electrode 60 and the second electrode 70 may be formed on the active layer 40 to contact both ends of the active layer 40. A protective layer 50 may be formed between the first electrode 60 and the second electrode 70 to cover the active layer 40. The protective layer 50 may be formed to extend above and cover the first electrode 60 and the second electrode 70. For example, the protective layer 50 may be formed on the gate insulating layer 20 to cover the active layer 40, on the first electrode 60, and on the second electrode 70. According to the example embodiments shown in FIGS. 1 to 6, the TFT may have a structure in which the protective layer 50 is formed to directly contact the active layer 40. According to the example embodiments shown in FIGS. 7 to 9, the TFT may have a structure in which an etch-stop layer is further included between the protective layer 50 and the active layer 40. The top gate electrode 90 may be formed on the protective layer 50 and be located above the active layer 40 between the first electrode 60 and the second electrode 70. The top gate electrode 90 may extend to cover the first electrode 60 or the second electrode 70 by interposing the protective layer 50 therebetween. FIG. 1 illustrates a case where the bottom gate electrode 30 is formed to partially c the first electrode 60 by interposing the gate insulating layer 20 therebetween, and the top gate electrode 90 is formed to partially overlap with the second electrode 70 by interposing the protective layer 50 therebetween. The bottom gate electrode 30 may be formed below the active layer 40 such that the bottom gate electrode 30 does not cover the first electrode 60. The top gate electrode 90 may be formed on the active layer 40 such that the top gate electrode 90 does not cover the second electrode 70.

The substrate 10 may be a substrate used to manufacture a semiconductor device. For example, the substrate 10 may be, for example, a glass substrate, a plastic substrate, or a silicon substrate. An oxide layer, e.g., a silicon oxide layer formed by thermal-oxidizing a silicon substrate, may be further formed on a surface of the substrate 10.

The top gate electrode 90 and the bottom gate electrode 30 control electrical characteristics of the active layer 40 and may be formed of a conductive material, e.g., a metal, an alloy thereof, a conductive metallic oxide, or a conductive metallic nitride. For example, the top gate electrode 90 and the bottom gate electrode 30 may be formed of a metal, for example, titanium (Ti), platinum (Pt), ruthenium (Ru), gold (Au), silver (Ag), molybdenum (Mo), aluminum (Al), tungsten (W), or copper (Cu), an alloy thereof, a conductive oxide, (e.g., an indium zinc oxide (IZO or InZnO) or an aluminum zinc oxide (AZO or AlZnO)).

The gate insulating layer 20 may be formed of an insulating material used for a semiconductor device. For example, the gate insulating layer 20 may be formed of a silicon oxide, a silicon nitride, a high-dielectric material having a higher permittivity than the silicon oxide, e.g., a hafnium oxide ($HfO_2$), an aluminum oxide ($Al_2O_3$), or a silicon nitride ($Si_3N_4$), or a mixture thereof.

The active layer 40 may be formed of various materials, for example, an oxide semiconductor, a nitride semiconductor, an organic semiconductor, 3-group, 4-group, and 5-group semiconductors of carbon (c), silicon (Si), germanium (Ge), SiGe, gallium nitride (GaN), gallium arsenic (GaAs), indium antimony (InSb), indium phosphorous (InP), cadmium sulfite (CdS), and the like and a compound thereof, a carbon nanotube, graphene, or a transition metal dichalcogenide material. For example, the active layer 40 may be formed by doping various material components into a nitride semiconductor, e.g., zinc oxynitride (ZnON).

Each of the first electrode 60 and the second electrode 70 may be formed of a conductive material, e.g., a metal, an alloy, a conductive metal oxide, or a conductive metal nitride. For example, each of the first electrode 60 and the second electrode 70 may be formed of a metal, for example, Ti, Pt, Ru, Au, Ag, Mo, Al, W, or Cu, an alloy thereof, a conductive oxide (e.g., IZO (InZnO) or AZO (AlZnO)). Each of the first electrode 60 and the second electrode 70 may have a single-layer or multi-layer structure.

The protective layer 50 may be formed of, for example, a silicon oxide layer, a silicon nitrogen oxide layer, a silicon nitride layer, an organic insulating layer, or a stacked structure of at least two thereof.

The substrate 10, the bottom gate electrode 30, the gate insulating layer 20, the active layer 40, the top gate electrode 90, the first electrode 60, the second electrode 70, and the protective layer 50 forming the TFT according to example embodiments may be formed of various materials used to manufacture a TFT and are not limited the materials described above.

Figure 2:
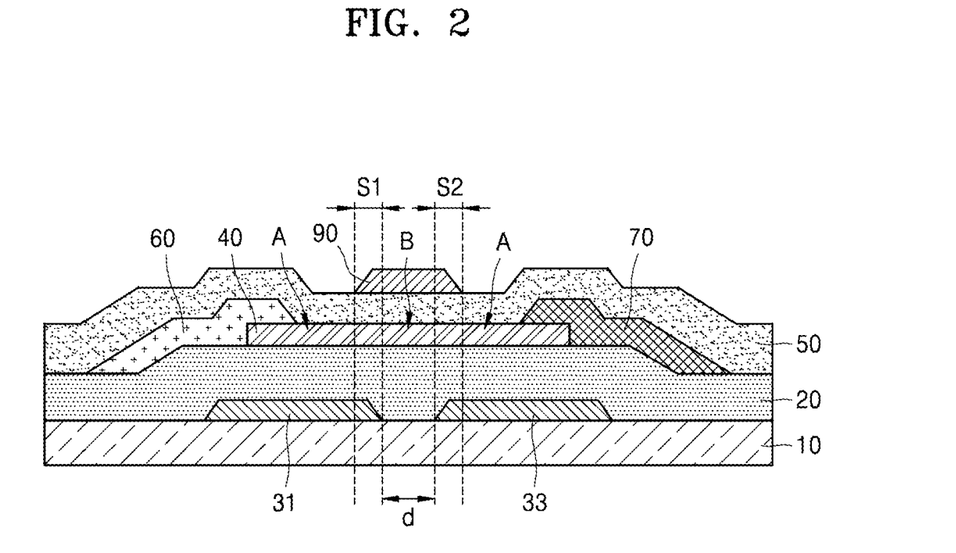
Figure 3:
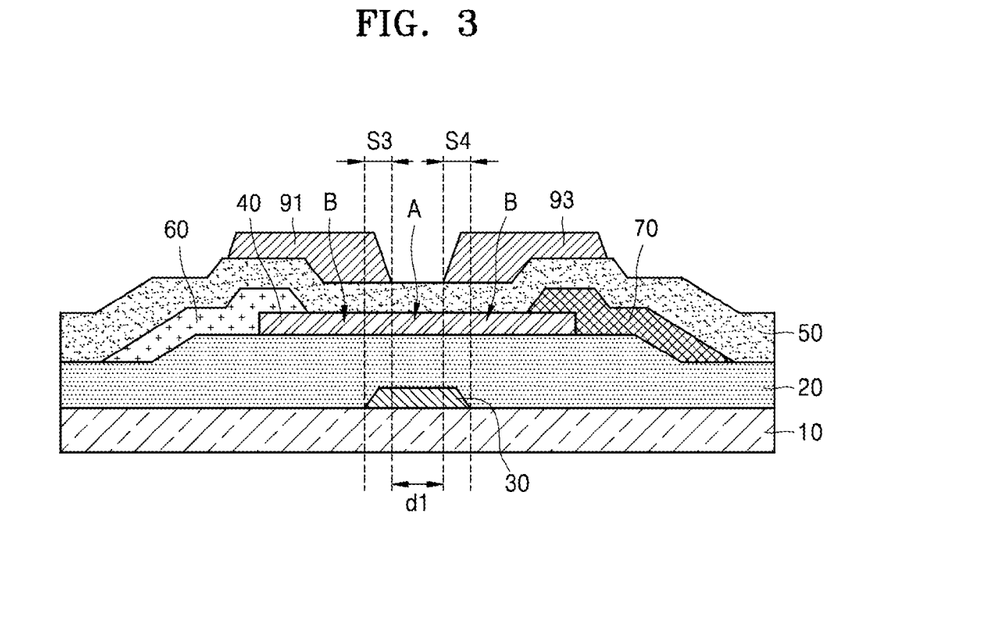
Figure 4:
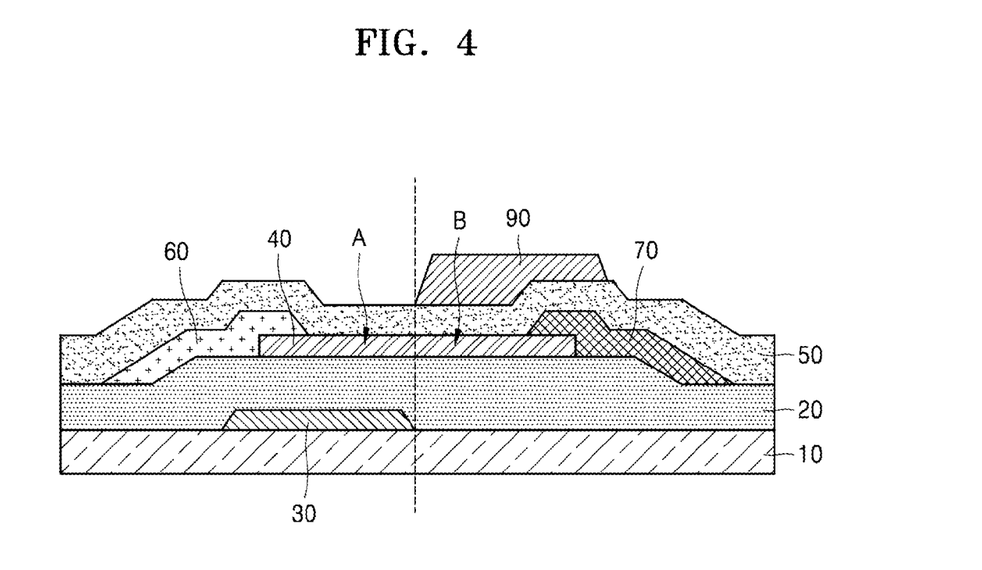

In the TFT according to the example embodiments shown in FIGS. 1 to 3, the bottom gate electrode 30 and the top gate electrode 90 may be formed to have a partial region or partial regions in which the bottom gate electrode 30 and the top gate electrode 90 vertically overlap with each other by interposing the active layer 40 therebetween. In the TFT according to the example embodiments shown in FIGS. 4 to 6, the bottom gate electrode 30 and the top gate electrode 90 may be formed not to vertically overlap with each other. Each of the bottom gate electrode 30 and the top gate electrode 90 may be formed by a single gate electrode as shown in FIGS. 1 and 4. Any one of the bottom gate electrode 30 and the top gate electrode 90 may be formed by a plurality of gate electrodes separated from each other as shown in FIGS. 2, 3, 5, and 6.

Referring to FIG. 1, the bottom gate electrode 30 and the top gate electrode 90 may be individual single gate electrodes, and may vertically overlap with each other at a partial region S. The bottom gate electrode 30 and the top gate electrode 90 may be formed to extend in opposite directions. In FIG. 1, the partial region S denotes a width of a region at which the bottom gate electrode 30 and the top gate electrode 90 vertically overlap with each other.

Referring to FIG. 2, the bottom gate electrode 30 may include first and second bottom gate electrodes 31 and 33, which are separated from each other by a distance d below the active layer 40. The top gate electrode 90 may be formed on the active layer 40 and be located between the first and second bottom gate electrodes 31 and 33 so that portions of both ends of the top gate electrode 90 partially vertically overlap with the first and second bottom gate electrodes 31 and 33 by interposing the active layer 40 therebetween. In FIG. 2, a first partial region S1 denotes a width of a region at which the first bottom gate electrode 31 and the top gate electrode 90 vertically overlap with each other, and a second partial region S2 denotes a width of a region at which the second bottom gate electrode 33 and the top gate electrode 90 vertically overlap with each other.

As shown in FIG. 2, when the top gate electrode 90 is a single gate electrode, and the bottom gate electrode 30 includes the first and second bottom gate electrodes 31 and 33, the active layer 40 may have the second region B driven by the top gate electrode 90 between the first region A, which is driven by the first and second bottom gate electrodes 31 and 33. The first region A and the second region B may have or may not have a shared region.

Referring to FIG. 3, the top gate electrode 90 may include first and second top gate electrodes 91 and 93, which are separated from each other by a distance d1 on the active layer 40. The bottom gate electrode 30 may be formed below the active layer 40 and be located between the first and second top gate electrodes 91 and 93 so that portions of both ends of the bottom gate electrode 30 partially vertically overlap with the first and second top gate electrodes 91 and 93 by interposing the active layer 40 therebetween. In FIG. 3, a third partial region S3 denotes a width of a region at which the first top gate electrode 91 and the bottom gate electrode 30 vertically overlap with each other, and a fourth partial region S4 denotes a width of a region at which the second top gate electrode 93 and the bottom gate electrode 30 vertically overlap with each other.

As shown in FIG. 3, when the bottom gate electrode 30 is a single gate electrode, and the top gate electrode 90 includes the first and second top gate electrodes 91 and 93, the active layer 40 may have the first region A driven by the bottom gate electrode 30 between the second region B, which is driven by the first and second top gate electrodes 91 and 93. The first region A and the second region B may have or may not have a shared region.

In FIGS. 1 to 3, the distances d and d1, the widths S1, S2, S3, and S4 of the overlapping regions may be within a range in which the top gate electrode 90 and the bottom gate electrode 30 can control the conductivity of the single active layer 40.

Figure 5:
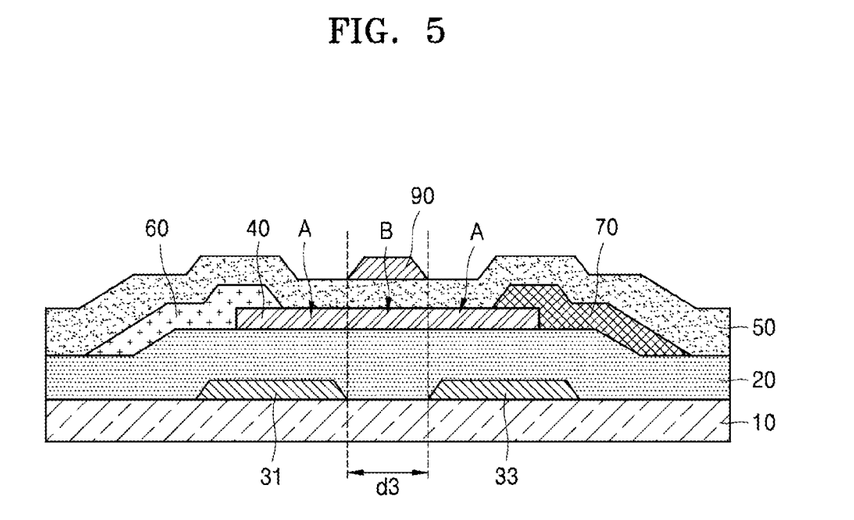
Figure 6:
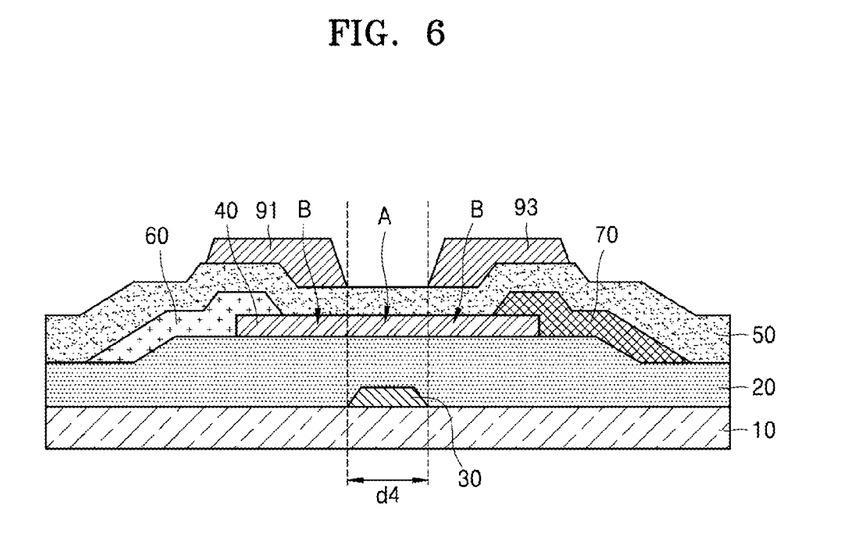

The top gate electrode 90 and the bottom gate electrode 30 may be formed to not vertically overlap with each other by interposing the active layer 40 therebetween as shown in FIGS. 4 to 6. FIG. 4 shows a TFT having a structure similar to FIG. 1. Referring to FIG. 4, the top gate electrode 90 and the bottom gate electrode 30 are formed as individual single gate electrodes with the active layer 40 interposed therebetween and are provided to not vertically overlap with each other. FIG. 5 shows a TFT having a structure similar to FIG. 2. Referring to FIG. 5, the bottom gate electrode 30 includes the first and second bottom gate electrodes 31 and 33, which are separated from each other by a distance d3. The top gate electrode 90 is formed on the active layer 40 with the active layer 40 interposed therebetween and is provided between the first and second bottom gate electrodes 31 and 33 with no overlapping regions with the top gate electrode 60. FIG. 6 shows a TFT having a structure similar to FIG. 3. Referring to FIG. 6, the top gate electrode 90 includes the first and second top gate electrodes 91 and 93, which are separated from each other by a distance d4. The bottom gate electrode 30 is formed below the active layer 40 with the active layer 40 interposed therebetween and is located between the first and second top gate electrodes 91 and 93 with no overlapping regions with the bottom gate electrode 30. Referring to FIGS. 4 to 6, an end or ends of the top gate electrode 90 are provided to vertically meet an end or ends of the bottom gate electrode 30. However, the end(s) of the top gate electrode 90 may be vertically separated from the end(s) of the bottom gate electrode 30 by a desired (or alternatively, predetermined) distance, which is within a range in which a current can flow through the TFT when a turn-on voltage is applied to both the top gate electrode 90 and the bottom gate electrode 30.

Figure 7:
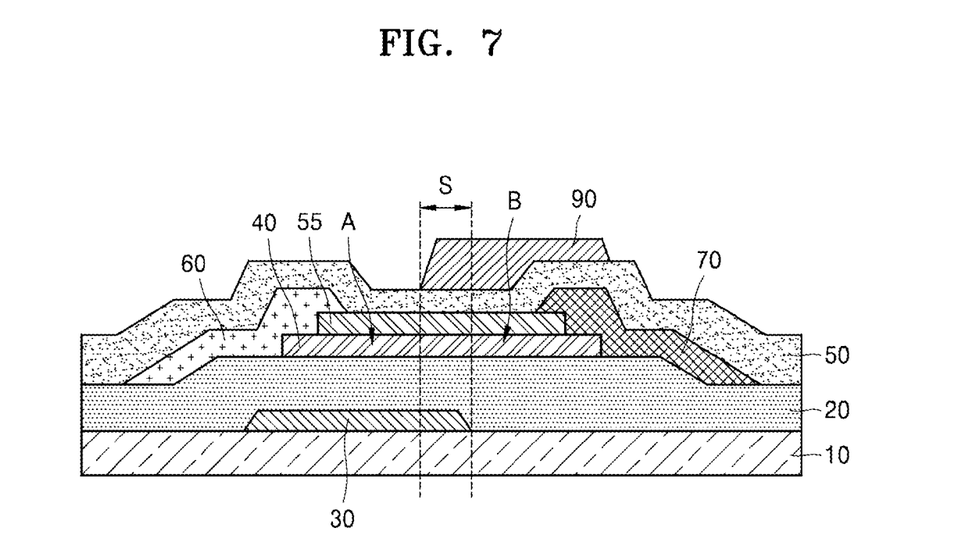
Figure 8:
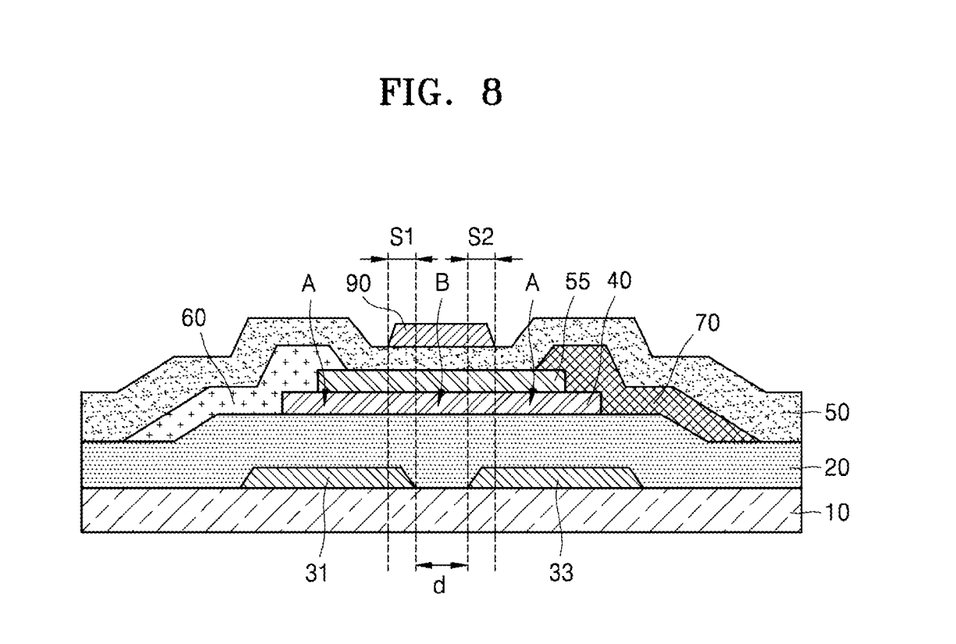
Figure 9:
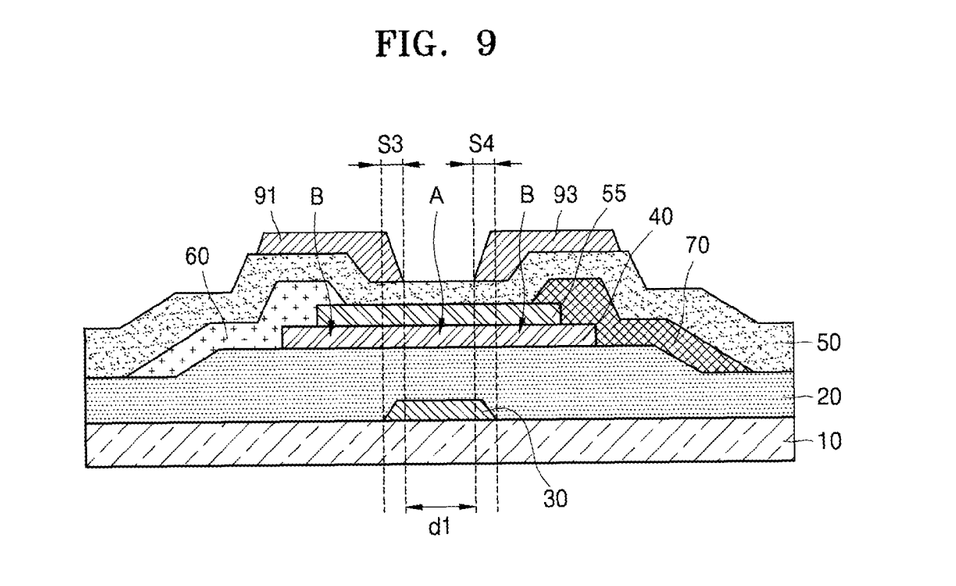

According to some example embodiments, the TFT may further include an etch-stop layer 55 between the active layer 40 and the protective layer 50 as shown in FIGS. 7 to 9. FIGS. 7 to 9 show TFTs having gate structures similar to FIGS. 1 to 3, respectively. Referring FIGS. 7 to 9, the etch-stop layer 55 may be further included between the active layer 40 and the protective layer 50. As shown in FIGS. 4 to 6, the TFT according to some example embodiments may be provided such that the active layer 40 is interposed between the top gate electrode 90 and the bottom gate electrode 30, the etch-stop layer 55 is further included between the active layer 40 and the protective layer 50, and the top gate electrode 90 and the bottom gate electrode 30 do not vertically overlap with each other.

As shown in FIGS. 7 to 9, when the etch-stop layer 55 is included, the etch-stop layer 55 may be formed on the active layer 40 except for portions of the active layer 40 to be used as contact areas for the first electrode 60 and the second electrode 70. The first electrode 60 and the second electrode 70 may be formed to contact both ends of the active layer 40. The first electrode 60 and the second electrode 70 may also be formed to contact both ends of the etch-stop layer 55. The etch-stop layer 55 may function to prevent damage on the active layer 40 during an etching process for forming the first electrode 60 and the second electrode 70. The etch-stop layer 55 may include, for example, a silicon oxide, a silicon nitride, or an organic insulating material.

Although any one of the bottom gate electrode 30 and the top gate electrode 90 is formed by two gate electrodes separated from each other, and the other one is formed by a single gate electrode have been described above with respect to FIGS. 2, 3, 5, 6, 8, and 9, the TFT according to example embodiments is not limited thereto. For example, any one of the bottom gate electrode 30 and the top gate electrode 90 may be formed by three or more gate electrodes separated from each other, and the other one may be formed by two or more gate electrodes respectively disposed between the three or more gate electrodes.

According to the TFT according to the example embodiments as described above, the TFT is turned on to flow a current therethrough only when a turn-on voltage is applied to both the bottom gate electrode 30 and the top gate electrode 90. If a turn-off voltage is applied to one of the bottom gate electrode 30 and the top gate electrode 90, the TFT is turned off, and thus a current does not flow.

The TFT according to the example embodiments as described above may be used as, for example, a switching device in a pixel of an active matrix display.

Figure 10:
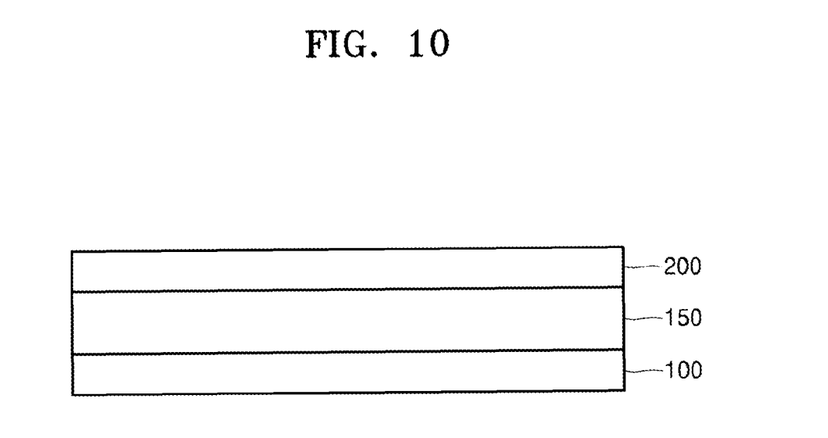
FIG. 10 is a cross-sectional view of a display including a TFT according to an example embodiment.

FIG. 10 is a cross-sectional view of a display including a TFT according to an example embodiment. The display according to the current example embodiment may be a flat panel display, e.g., a liquid crystal display.

Referring to FIG. 10, a liquid crystal layer 150 may be provided between a first substrate 100 and a second substrate 200. The first substrate 100 may be an array substrate including the TFT according to the example embodiments, which have been described with reference to FIGS. 1 to 9, as a switching device. The first substrate 100 may include a pixel electrode (not shown) connected to the TFT. The second substrate 200 may include an opposite electrode (not shown) corresponding to the pixel electrode. A liquid crystal arrangement state of the liquid crystal layer 150 may vary according to a voltage applied between the first substrate 100 and the second substrate 200. The configurations of the display including the TFT according to example embodiments are not limited to the structure of FIG. 10 and may have various structures.

Figure 11A:
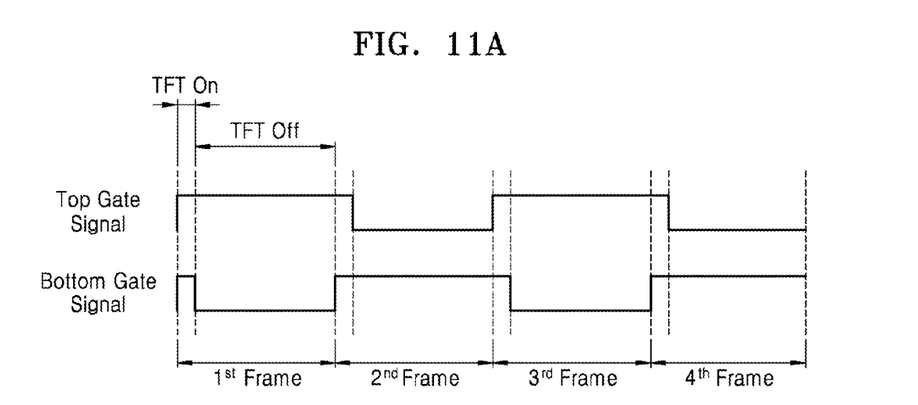
FIGS. 11A and 11B are timing diagrams illustrating methods of driving a TFT according to example embodiments when the TFT is used as a switching device in a pixel of a display, according to some example embodiments.
Figure 11B:
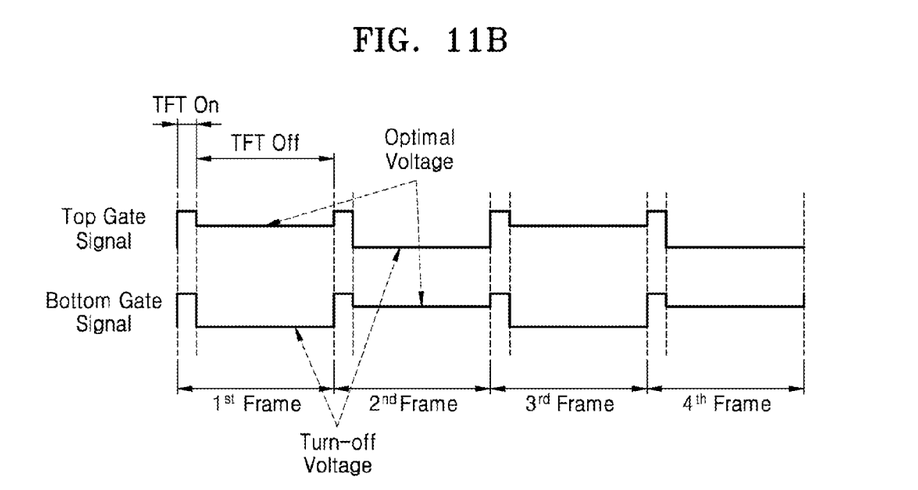

FIG. 11A is a timing diagram illustrating a method of driving a TFT according to example embodiments when the TFT is used as a switching device in a pixel of a display, according to an example embodiment. FIG. 11B is a timing diagram illustrating a method of driving a TFT according to example embodiments when the TFT is used as a switching device in a pixel of a display, according to another example embodiment. In FIGS. 11A and 11B, Top Gate Signal refers to a voltage applied to the top gate electrode 90, and Bottom Gate Signal refers to a voltage applied to the bottom gate electrode 30.

Referring to FIG. 11A, to drive the TFT used as a switching device in a pixel of a display, a turn-on voltage is applied to both the bottom gate electrode 30 and the top gate electrode 90 for a turn-on time period TFT On during each frame so that a current flows through the TFT. For a turn-off time period TFT Off, a turn-off voltage is applied to any one of the bottom gate electrode 30 and the top gate electrode 90, and a voltage different from the turn-off voltage, e.g., the turn-on voltage, may be applied to the other one thereof, thereby turning the TFT off. During a plurality of frames, the turn-off voltage and the turn-on voltage may be alternately applied to the top gate electrode 90 and the bottom gate electrode 30 for the turn-off time periods TFT Off, respectively.

For example, during a first frame, the turn-on voltage is applied to both the bottom gate electrode 30 and the top gate electrode 90 for a turn-on time period TFT On of the TFT so that a current flows through the TFT, and thereafter, while the turn-on voltage is still applied to the top gate electrode 90, the turn-off voltage is applied to the bottom gate electrode 30, thereby turning the TFT off. During a second frame, the turn-on voltage is applied to both the bottom gate electrode 30 and the top gate electrode 90 for a turn-on time period TFT On of the TFT so that a current flows through the TFT, and thereafter, in an opposite way to the first frame, while the turn-on voltage is still applied to the bottom gate electrode 30, the turn-off voltage is applied to the top gate electrode 90, thereby turning the TFT off. Likewise, during each frame, the turn-on voltage is applied to both the bottom gate electrode 30 and the top gate electrode 90 for a turn-on time period TFT On of the TFT so that a current flows through the TFT, and thereafter, the turn-off voltage is alternately applied to either one of the bottom gate electrode 30 and the top gate electrode 90, thereby turning the TFT off.

Assuming that a turn-on time period TFT On and a turn-off time period TFT Off during one frame are A and B, respectively, the turn-on voltage for a time period of A+B+A and the turn-off voltage for a time period of B are alternatively applied to the top gate electrode 90 and the bottom gate electrode 30, respectively. In each frame, the turn-on voltage is simultaneously applied to the top gate electrode 90 and the bottom gate electrode 30 for the turn-on time period. In the turn-off time period, the turn-on voltage is alternately applied to any one of the top gate electrode 90 and the bottom gate electrode 30, and the turn-off voltage is alternately applied to the other one.

For example, during the first frame, the turn-on voltage is applied to both the bottom gate electrode 30 and the top gate electrode 90 for a time period A, and thereafter, for a time period B, the turn-off voltage is applied to the bottom gate electrode 30, and the turn-on voltage is applied to the top gate electrode 90.

During the second frame following the first frame, the turn-on voltage is applied to both the bottom gate electrode 30 and the top gate electrode 90 for the time period A, and thereafter, for the time period B, the turn-off voltage is applied to the top gate electrode 90, and the turn-on voltage is applied to the bottom gate electrode 30.

During a third frame, the turn-on voltage is applied to both the bottom gate electrode 30 and the top gate electrode 90 for the time period A, and thereafter, for the time period B, the turn-off voltage is applied to the bottom gate electrode 30, and the turn-on voltage is applied to the top gate electrode 90.

During a fourth frame, the turn-on voltage is applied to both the bottom gate electrode 30 and the top gate electrode 90 for the time period A, and thereafter, for the time period B, the turn-off voltage is applied to the top gate electrode 90, and the turn-on voltage is applied to the bottom gate electrode 30.

As described above, during the first two frames, with respect to the top gate electrode 90, the turn-on voltage is applied for a time period A+B, the turn-on voltage is applied for the time period A and the turn-off voltage is applied for the time period B, and with respect to the bottom gate electrode 30, the turn-on voltage is applied for the time period A, the turn-off voltage is applied for the time period B, and the turn-on voltage is applied for the time period A+B. During a plurality of frames, this alternate input pattern of the turn-on voltage and the turn-off voltage is repeated. For example, the turn-on voltage for the time period A+B+A and the turn-off voltage for the time period B are alternatively applied to the top gate electrode 90 and the bottom gate electrode 30, and a turn-on voltage/turn-off voltage applying time difference between the top gate electrode 90 and the bottom gate electrode 30 is the time period A.

When the display is an active matrix display, the turn-on voltage is applied to both the top gate electrode 90 and the bottom gate electrode 30 of the TFT connected to a corresponding gate wiring for a time period obtained by dividing a time allocated to one frame by the total number of effective gate wirings. Thus, a turn-on time period may correspond to the time obtained by dividing the time allocated to one frame by the total number of effective gate wirings.

For example, when the display is an active matrix display and has 120 Hz and an FHD (1920*1080 pixels) resolution, one frame (=1/120) is about 8.3 msec, and the turn-on time of the TFT is about 8.3 msec/1080=7.7 μsec, where the numeric value 1080 corresponds to the number of effective gate wirings of the display. Because TFTs according to example embodiments includes the bottom gate electrode 30 and the top gate electrode 90, the total number of gate wirings of the display in which the TFT is used as a switching device in a pixel may be at least two times the number of effective gate wirings.

In the active matrix display having 120 Hz and an FHD (1920*1080 pixels) resolution, one frame is about 8.3 msec, and the turn-on time period A of the TFT is about 7.7 μsec, and thus, the turn-off time period B of the TFT is about 8.3 msec−A. Thus, in average, a time period during which the turn-on voltage is applied to each of the top gate electrode 90 and the bottom gate electrode 30 is A+B+A=A+8.3 msec−A+A=8.3 msec+A=8.3077 msec. In addition, a time during which the turn-off voltage is applied to each of the top gate electrode 90 and the bottom gate electrode 30 is B=8.3 msec−A. Because A is about 7.7 μsec, the turn-on voltage applying time A+B+A is about 8.3077 msec, and the turn-off voltage applying time B is about 8.2923 msec.

Thus, an on/off duty ratio of the turn-on voltage applying time to the turn-off voltage applying time is (A+B+A)/B=8.3077/8.2923, i. e., about 1.001.

According to example embodiments, methods of driving a TFT have almost no difference between a time period applying the turn-on voltage and a time period applying the turn-off voltage. Thus, on/off duty times may be almost the same.

Referring to FIG. 11B, to drive the TFT used as a switching device in a pixel of a display, in each frame, a turn-on voltage may be applied to both the bottom gate electrode 30 and the top gate electrode 90 for a turn-on time period TFT On so that a current flows through the TFT. Thereafter, a turn-off voltage may be applied to only any one of the bottom gate electrode 30 and the top gate electrode 90, thereby turning the TFT off. At this time, a desired (or alternatively, predetermined) voltage may be applied to the other gate electrode to which the turn-off voltage is not applied. During a plurality of frames, the turn-off voltage and the predetermined voltage are alternately applied to the top gate electrode 90 and the bottom gate electrode 30 for turn-off time periods TFT Off, respectively. In this case, the desired (or alternatively, predetermined) voltage may be an optimal voltage for improving the reliability of the TFT.

For example, during a first frame, the turn-on voltage is applied to both the bottom gate electrode 30 and the top gate electrode 90 for a turn-on time period TFT On of the TFT so that a current flows through the TFT. Thereafter, the optimal voltage is applied to the top gate electrode 90, and the turn-off voltage is applied to the bottom gate electrode 30, thereby turning the TFT off. During a second frame, the turn-on voltage is applied to both the bottom gate electrode 30 and the top gate electrode 90 for a turn-on time period TFT On of the TFT so that a current flows through the TFT. Thereafter, in an opposite way to the first frame, the turn-off voltage is applied to the top gate electrode 90, and the optimal voltage is applied to the bottom gate electrode 30, thereby turning the TFT off. Likewise, during each frame, the turn-on voltage is applied to both the bottom gate electrode 30 and the top gate electrode 90 for a turn-on time period TFT On of the TFT so that a current flows through the TFT. Thereafter, the turn-off voltage is alternately applied to one of the bottom gate electrode 30 and the top gate electrode 90, thereby turning the TFT off.

Assuming that a turn-on time period TFT On and a turn-off time period TFT Off during one frame are A and B, respectively, to each of the top gate electrode 90 and the bottom gate electrode 30, the turn-on voltage is applied for A, and the turn-off voltage and the optimal voltage is alternately applied for B. For example, during each frame, the turn-on voltage is simultaneously applied to the top gate electrode 90 and the bottom gate electrode 30 for the turn-on time period A, and with respect to a turn-off time, the turn-off voltage is alternately applied to any one of the top gate electrode 90 and the bottom gate electrode 30, and the optimal voltage is alternately applied to the other one.

For example, during the first frame, the turn-on voltage is applied to both the bottom gate electrode 30 and the top gate electrode 90 for A, and thereafter, for B, the turn-off voltage is applied to the bottom gate electrode 30, and the optimal voltage is applied to the top gate electrode 90.

During the second frame following the first frame, the turn-on voltage is applied to both the bottom gate electrode 30 and the top gate electrode 90 for A. Thereafter, for B, the turn-off voltage is applied to the top gate electrode 90, and the optimal voltage is applied to the bottom gate electrode 30.

During a third frame, the turn-on voltage is applied to both the bottom gate electrode 30 and the top gate electrode 90 for A. Thereafter, for B, the turn-off voltage is applied to the bottom gate electrode 30, and the optimal voltage is applied to the top gate electrode 90.

During a fourth frame, the turn-on voltage is applied to both the bottom gate electrode 30 and the top gate electrode 90 for A. Thereafter, for B, the turn-off voltage is applied to the top gate electrode 90, and the optimal voltage is applied to the bottom gate electrode 30.

As described above, during the four frames, to the top gate electrode 90, the turn-on voltage is applied for a time period of 4×A, the turn-off voltage is applied for a time period of 2×B, and the optimal voltage is applied for a time period of 2×B. Likewise, during the four frames, to the bottom gate electrode 30, the turn-on voltage is applied for a time period of 4×A, the turn-off voltage is applied for a time period of 2×B, and the optimal voltage is applied for a time period of 2×B. During a plurality of frames, this input pattern of the turn-on voltage, the optimal voltage, the turn-on voltage, and the turn-off voltage is repeated.

According to the method of driving a TFT according to this example embodiment, because the optimal voltage is applied for a time period equivalent to a turn-off time, the on/off duty times may be substantially the same.

According to the methods of driving a TFT according to this example embodiment, an on/off duty ratio is about 1. Thus, there is substantially no difference between a time period applying the turn-on voltage and corresponding voltage applying time and a time period applying the turn-off voltage. Thus, carriers, e.g., holes or electrons that are trapped/detrapped in an interface between the gate insulating layer 20 and the active layer 40 or inside the gate insulating layer 20 exists in almost the same numbers. Thus, the carriers are not accumulated in the interface between the gate insulating layer 20 and the active layer 40 or inside the gate insulating layer 20 as time elapses. Accordingly, a substantial change in a threshold voltage may not occur, and thus a highly reliable TFT may be implemented.

Figure 12:
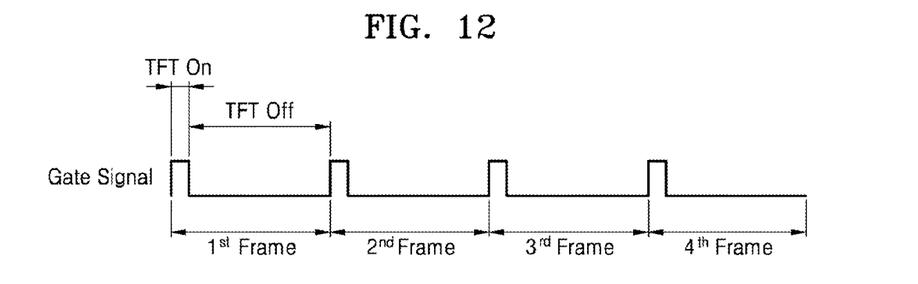
FIG. 12 is a timing diagram illustrating a method of driving a typical TFT when the TFT is used as a switching device in a pixel of a display, as a comparative example.

However, according to a method of driving a typical TFT as shown in FIG. 12, an on/off duty ratio is about 0.001 when a display has 120 Hz and an FHD (1920*1080 pixels) resolution as described above. Because a difference between a time period applying a turn-on voltage and a time period applying a turn-off voltage applying time is large, carriers are trapped and accumulated in an interface or inside a gate insulating layer. Accordingly, a substantial change in a threshold may occur as time goes by.

Figure 13A:
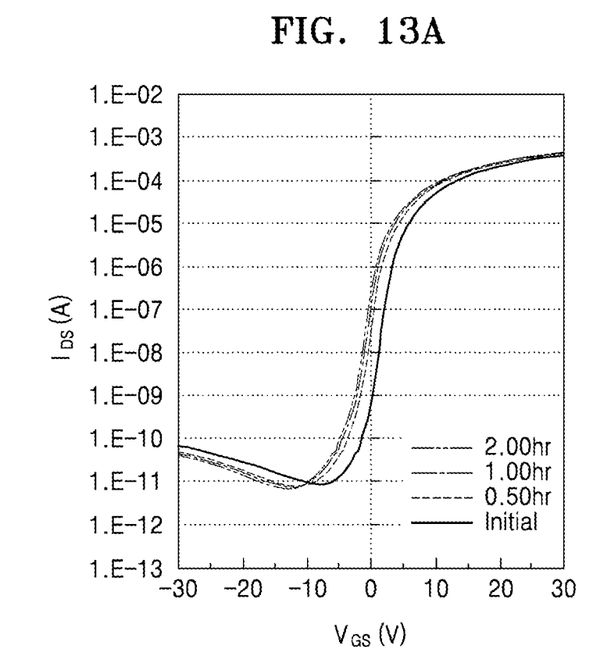
FIGS. 13A and 13B are graphs respectively illustrating a transition of a source-drain current and a transition of a threshold voltage for two elapses after applying a negative voltage (−20 V) to a gate electrode when the existing TFT is an n-type TFT.
Figure 13B:
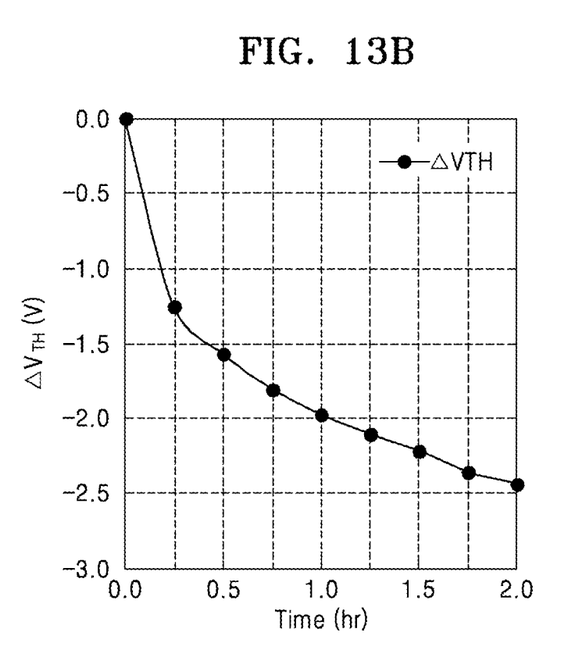

FIGS. 13A and 13B are graphs respectively illustrating a transition of a source-drain current and a transition of a threshold voltage $V_{th}$ for two hours elapses after applying a negative voltage (−20 V) to a gate electrode when the existing TFT is an n-type TFT. As shown in FIGS. 13A and 13B, a change in the source-drain current and the threshold voltage $V_{th}$ becomes large as time elapses.

Figure 14:
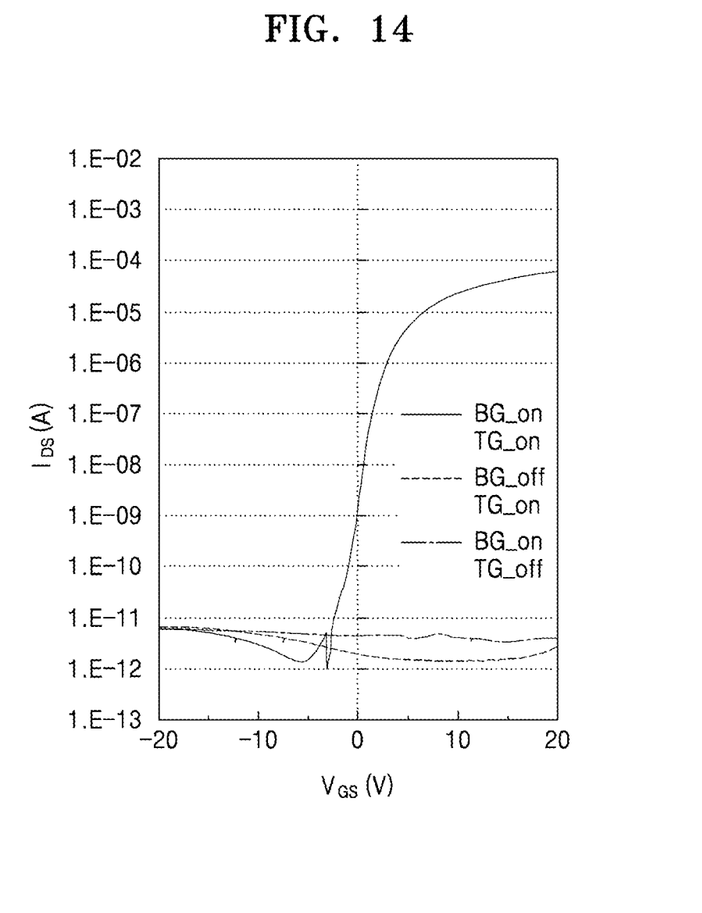
FIG. 14 is a graph illustrating an operational characteristic of a TFT according to an example embodiment according to voltages applied to a top gate electrode and a bottom gate electrode of the TFT.

FIG. 14 is a graph illustrating an operational characteristic of a TFT according to an example embodiment with respect to voltages applied to a top gate electrode TG and a bottom gate electrode BG of the TFT. The TFT is turned on only when turn-on voltages BG_on and TG_on are simultaneously applied to the bottom gate electrode BG and the top gate electrode TG, respectively, and if a turn-off voltage is applied to either one of the bottom gate electrode BG and the top gate electrode TG (e.g., BG_off & TG_on or BG_on & TG_off), the TFT is turned off.

Figure 15A:
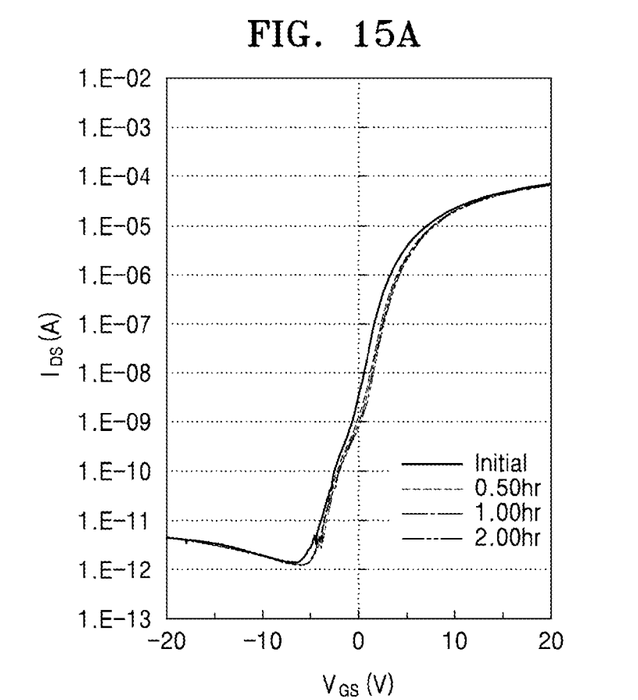
FIGS. 15A and 15B are graphs respectively illustrating a transition of a source-drain current and a transition of a threshold voltage for two elapses after applying voltages to the top gate electrode and the bottom gate electrode with TFTs and driving methods according to example embodiments.
Figure 15B:
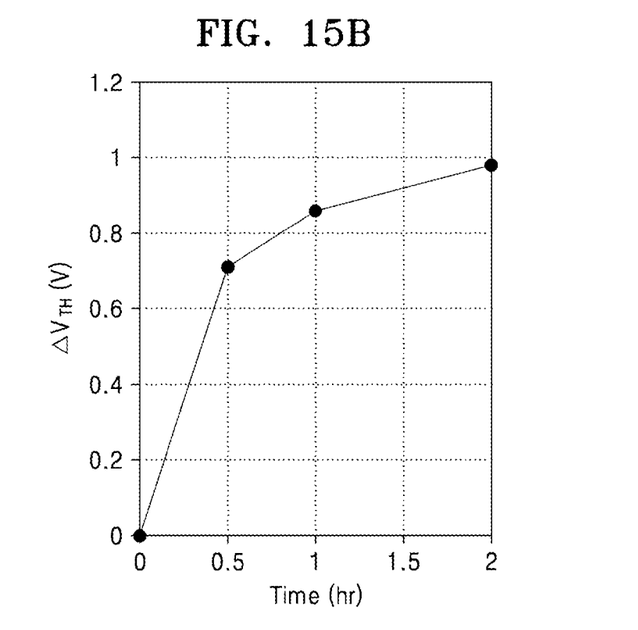

FIGS. 15A and 15B are graphs respectively illustrating a transition of a source-drain current and a transition of a threshold voltage for two hours after applying voltages to the top gate electrode TG and the bottom gate electrode BG with TFTs and driving methods according to example embodiments.

As shown in FIGS. 15A and 15B, by the TFT structure and the driving method according to some example embodiments, a change in the source-drain current and the threshold voltage $V_{th}$ may be substantially reduced.

As described above, according to the one or more of the above example embodiments, one active layer is driven using a top gate electrode and a bottom gate electrode, and a time period applying a turn-on voltage is almost the same as a time period applying a turn-off voltage. Thus, on and off duty times are almost the same, thereby achieving a highly reliable TFT, a threshold voltage of which hardly changes.

It should be understood that the example embodiments described therein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope of example embodiments as defined by the following claims.

What is claimed is:

1. A thin film transistor (TFT) comprising:
   an active layer;
   a bottom gate electrode below the active layer to drive a first region of the active layer; and
   a top gate electrode on the active layer to drive a second region of the active layer, the bottom and top gate electrodes configured to control conductivity of the active layer, wherein one of the top and bottom gate electrodes are arranged to be offset with respect to the other one of the top and bottom gate electrodes along a vertical direction such that one edge of the top gate electrode and one edge of the bottom gate electrode are provided past the one edge of the bottom gate electrode and the one edge of the top gate electrode, respectively, the bottom gate electrode includes a third region overlapping with the active layer and a fourth region overlapping with one of the top gate electrode or a source/drain region of the TFT, and the third region is substantially longer than the fourth region, and
   wherein the bottom gate electrode is a single gate electrode.

2. The TFT of claim 1, wherein the top gate electrode is a single gate electrode, is disposed to extend in a direction opposite to an extension direction of the bottom gate electrode, and partially overlaps with the bottom electrode in the vertical direction.

3. The TFT of claim 1, wherein the top gate electrode includes first and second top sub gate electrodes separated from each other, the first top sub gate electrode includes a first partial region, and the second top sub gate electrode includes a second partial region, and
   the bottom gate electrode is between the first and second top sub gate electrodes and vertically overlaps with the first and second top sub gate electrodes at the first and second partial regions, respectively.

4. The TFT of claim 1, wherein the first region and the second region includes a region of the active layer in common.

5. The TFT of claim 1, wherein the first region and the second region are spaced apart from each other and include a fifth region therebetween, and
   a length of the fifth region is sufficiently short such that a current flows between a source electrode and a drain electrode through the active layer when a turn-on voltage is applied to both the bottom gate electrode and the top gate electrode.

6. The TFT of claim 1, further comprising:
a substrate having the bottom gate electrode thereon;
a gate insulating layer on the bottom gate electrode and under the active layer;
a source electrode and a drain electrode in contact with both ends of the active layer; and
a protective layer covering the active layer and under the top gate electrode.

7. The TFT of claim 6, further comprising an etch-stop layer between the active layer and the protective layer.

8. The TFT of claim 6, wherein the protective layer is in direct contact with the active layer.

9. A display using the TFT of claim 1 as a switching device in a pixel.

10. The display using the TFT of claim 9, the TFT further comprising:
a substrate having the bottom gate electrode thereon;
a gate insulating layer on the bottom gate electrode and under the active layer;
a source electrode and a drain electrode in contact with both ends of the active layer; and
a protective layer covering the active layer and under the top gate electrode.

11. The display using the TFT of claim 10, the TFT further comprising an etch-stop layer between the active layer and the protective layer.

12. A thin film transistor (TFT) comprising:
an active layer;
a bottom gate electrode below the active layer to drive a first region of the active layer; and
a top gate electrode on the active layer to drive a second region of the active layer, the bottom and top gate electrodes configured to control conductivity of the active layer, wherein one of the top and bottom gate electrodes are arranged to be offset with respect to the other one of the top and bottom gate electrodes along a vertical direction such that the bottom gate electrode and the top gate electrode are provided to not have a region at which the bottom gate electrode and the top gate electrode vertically overlap with each other and neighboring edges of the top and bottom gate electrodes are aligned in a same vertical plane.

13. The TFT of claim 12, wherein the bottom gate electrode includes first and second bottom sub gate electrodes separated from each other, and the top gate electrode is between the first and second bottom sub gate electrodes.

14. The TFT of claim 12, wherein the top gate electrode includes first and second top sub gate electrodes separated from each other, and
the bottom gate electrode is between the first and second top sub gate electrodes.

15. A method of driving a thin film transistor (TFT), the TFT including an active layer, a bottom gate electrode below the active layer to drive a first region of the active layer, and a top gate electrode on the active layer to drive a second region of the active layer, the bottom and top gate electrodes configured to control conductivity of the active layer, the TFT used as a switching device in a pixel of a display, the method comprising:
applying a turn-on voltage to both the bottom gate electrode and the top gate electrode for a turn-on time period so that a current flows through the TFT, during each frame; and
applying a turn-off voltage to any one of the bottom gate electrode and the top gate electrode for a turn-off time period so that the TFT is turned off, during each frames,
wherein when the TFT is turned off, the turn-off voltage is alternately applied to one of the top gate electrode and the bottom gate electrode with respect to each consecutive frame.

16. The method of claim 15, wherein the turn-on voltage is applied to both the top gate electrode and the bottom gate electrode for the turn-on time period, and for the turn-off time period, the turn-on voltage is applied to any one of the top gate electrode and the bottom gate electrode and the turn-off voltage is applied to the other one, alternatively with respect to each consecutive frame.

17. The method of claim 15, wherein the turn-on voltage is applied to both the top gate electrode and the bottom gate electrode for the turn-on time period, and for the turn-off time period, the turn-on voltage is applied to any one of the top gate electrode and the bottom gate electrode and a predetermined voltage is applied to the other one, alternatively, with respect to each consecutive frame.

18. The method of claim 15, wherein the display is an active matrix display, the turn-on voltage is applied to both the top gate electrode and the bottom gate electrode of the TFT connected to a corresponding gate wiring for a turn-on time period, the turn-on time period obtained by dividing a time allocated to one frame by a total number of effective gate wirings.

* * * * *

UNITED STATES PATENT AND TRADEMARK OFFICE
CERTIFICATE OF CORRECTION

| | | |
|---|---|---|
| PATENT NO. | : 9,660,091 B2 | Page 1 of 1 |
| APPLICATION NO. | : 14/453137 | |
| DATED | : May 23, 2017 | |
| INVENTOR(S) | : Eok-su Kim et al. | |

It is certified that error appears in the above-identified patent and that said Letters Patent is hereby corrected as shown below:

On the Title Page

Item (72) should read:
(72) Inventors: Eok-Su Kim, Seongnam-si (KR);
　　　　　　　　Myung-kwan Ryu, Yongin-si (KR);
　　　　　　　　Kyoung-seok Son, Seoul (KR);
　　　　　　　　Sun-hee Lee, Suwon-si (KR).

Signed and Sealed this
Ninth Day of July, 2019

Andrei Iancu
*Director of the United States Patent and Trademark Office*